United States Patent
Chien (10) Patent No.: US 8,102,010 B2
(45) Date of Patent: Jan. 24, 2012

(54) APPARATUS FOR REDUCING PARASITIC CAPACITANCE IN A SEMICONDUCTOR DEVICE

(75) Inventor: Hung-Ming Chien, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 644 days.

(21) Appl. No.: 11/320,471

(22) Filed: Dec. 29, 2005

(65) Prior Publication Data

US 2007/0069329 A1    Mar. 29, 2007

Related U.S. Application Data

(60) Provisional application No. 60/720,653, filed on Sep. 27, 2005.

(51) Int. Cl.
*H01L 29/76* (2006.01)

(52) U.S. Cl. .................. 257/386; 257/508; 257/503

(58) Field of Classification Search ............. 257/532, 257/539, E27.021, E29.345, 386, 503, 508, 257/149, 291, 293
See application file for complete search history.

(56) References Cited

U.S. PATENT DOCUMENTS

| 4,001,869 A * | 1/1977 | Brown | 257/532 |
| 2002/0153563 A1 * | 10/2002 | Ogura | 257/347 |

* cited by examiner

*Primary Examiner* — Eugene Lee
(74) *Attorney, Agent, or Firm* — Sterne, Kessler, Goldstein & Fox P.L.L.C.

(57) ABSTRACT

A semiconductor device exhibiting low parasitic resistance comprises a first substrate characterized by a first resistivity; a second substrate characterized by a second resistivity, a third substrate and a metal element. These substrates form a multi-layer semiconductor device where the second substrate is formed on the first substrate; the third substrate is formed on the second substrate; and the metal element is formed on the third substrate. The second substrate is electrically grounded and is highly doped with acceptor dopant as compared to the first substrate. In this way, the second resistivity is lower than the first resistivity.

15 Claims, 8 Drawing Sheets

APPARATUS FOR REDUCING PARASITIC CAPACITANCE IN A SEMICONDUCTOR DEVICE

CROSS-REFERENCE TO RELATED APPLICATIONS

This application claims priority to U.S. Provisional Application No. 60/720,653, filed Sep. 27, 2005, entitled "Apparatus and Method for Reducing Parasitic Capacitance in a Semiconductor Device," incorporated herein by reference in its entirety.

BACKGROUND OF THE INVENTION

As wireless devices are becoming increasingly faster and smaller, the power consumption, reliability, and performance of a voltage controlled oscillator (VCO) in such devices have become a design focus. A VCO is typically used in modulating and demodulating a radio frequency (RF) signal by mixing the un-modulated or modulated signal with a locally generated oscillating signal. For example, when demodulating a RF signal, it is important to accurately match the VCO's generated oscillating signal with the RF's carrier signal. This is especially critical in high frequency application, as phase noise and jitters are more prevalent and detrimental to the performance of the VCO.

In high frequency application, the accurate generation of a high frequency oscillating signal depends on several factors such as the tunability of the VCO, Q factor, and the parasitic elements of the VCO's components. The tunability factor of the VCO is determined by the change of frequency generated by the VCO over the change of the input control voltage. Even though a VCO could be optimally designed for a specific high frequency application, manufacturing process tolerances will invariably introduce inaccuracies into the VCO. Thus it is important for a VCO to be tunable. Generally, it is desirable for a VCO to have a wide range of tunable frequency. However, broad tuning capability increases the VCO's susceptibility to noise and system variations due to the enhanced tuning sensitivity. As a result, it is important to maintain a high Q factor by lowering the parasitic components of the VCO's circuit. VCO tuning is implemented using a LC tank circuit including one or more inductors and capacitors.

Phase noise of the VCO can be reduced by maintaining a high Q factor in the LC tank. A high Q in the LC tank not only reduces phase noise but also increases performance and reduces power consumption of the VCO. To maintain a high Q in the LC tank, the parasitic components of the VCO's circuit must be reduced.

There are three parasitic components in a semiconductor device. They are resistive, capacitive, and inductive. These parasitic components negatively affect the reliability, performance, and power consumption of the device. In high frequency application, the inductors and capacitors of the VCO are generally integrated into a semiconductor device. Several methods are available to reduce the parasitic components of the device as a whole. For example, in fabricating an inductor, trenches or void space are introduced into a substrate layer directly underneath the inductor. The same method can also be used in fabricating the capacitor.

Typically, reduction of parasitic components are focused on the inductors and the capacitors. But as a semiconductor device gets progressively smaller it becomes more sensitive to signal propagation delays caused by parasitic resistance and capacitance inherent to the interconnection lines within the device. A wider interconnection line could be used to ease this problem; however, this will increase the parasitic capacitance of the line to the ground. Even though the parasitic capacitance and resistance of an interconnection line may seem small by itself, collectively it could reduce the Q factor of the semiconductor device. Thus to increase the performance of the semiconductor device and to maintain a high Q factor, it is necessary to reduce the parasitic components inherent to the interconnection lines.

Accordingly, there is a need in the art for a semiconductor device and a method to fabricate such a semiconductor device with reduced parasitic resistance and capacitance.

BRIEF DESCRIPTION OF THE DRAWINGS/FIGURES

The present invention is described with reference to the accompanying drawings.

DETAILED DESCRIPTION OF THE INVENTION

This specification discloses one or more embodiments that incorporate the features of this invention. The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

An embodiment of the present invention is now described. While specific methods and configurations are discussed, it should be understood that this is done for illustration purposes only. A person skilled in the art will recognize that other configurations and procedures may be used without departing from the spirit and scope of the invention.

Figure 1:
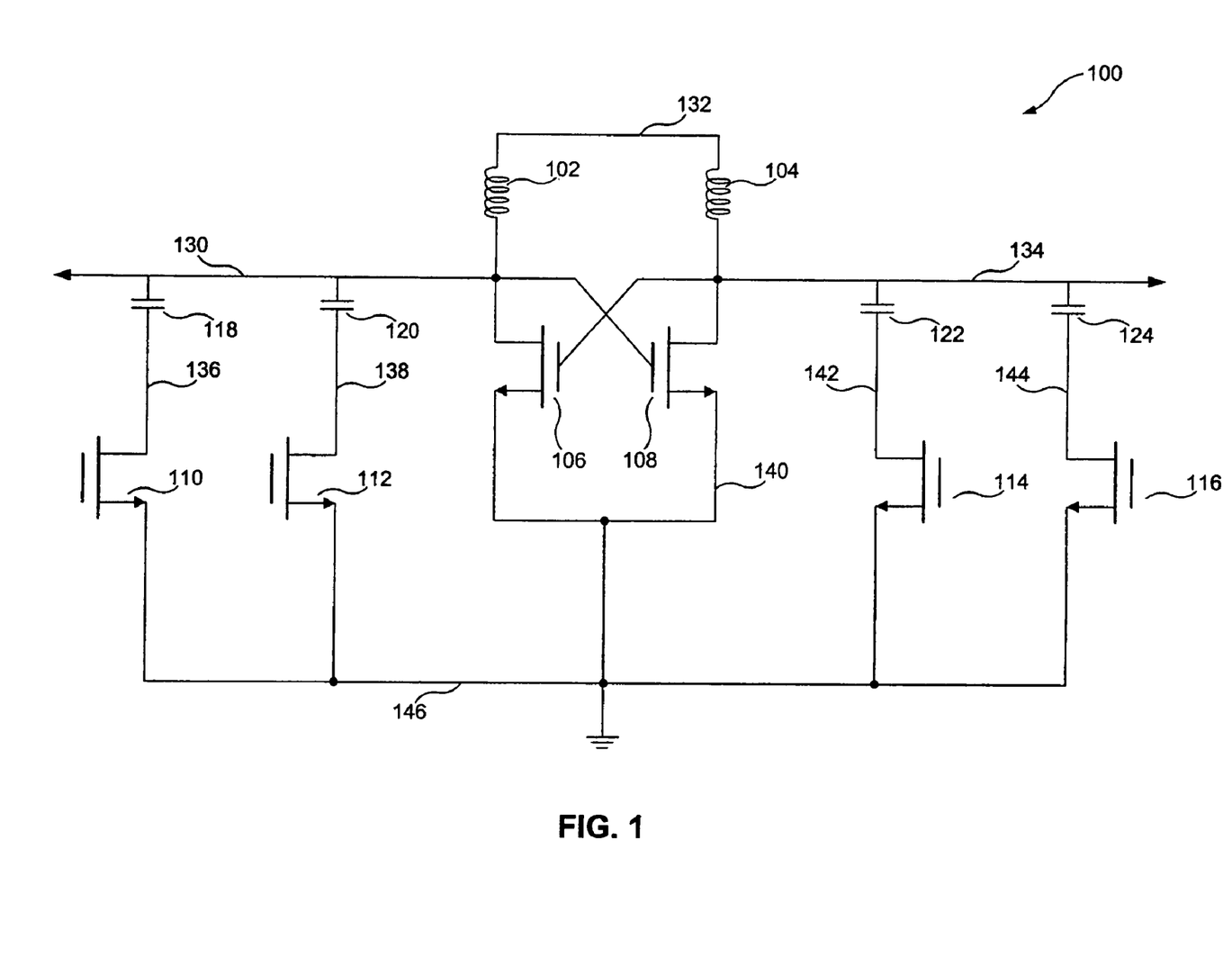
FIG. 1 illustrates an exemplary schematic of a VCO that may incorporate embodiments of the present invention.

FIG. 1 illustrates a VCO circuit that may employ embodiments of the present invention. The VCO circuit includes a pair of inductors 102 and 104, and two pairs of capacitors 118, 120, 122, and 124 that overall comprise a LC tank. The VCO also comprises a pair of cross-coupled n-channel MOSFET (NMOS) 106 and 108. Four switches 110, 112, 114, and 116 provide frequency tuning by switching in corresponding capacitors 118, 120, 122, and 124, respectively. Even though NMOS devices are shown in FIG. 1, other types of devices may be used such as JFET, p-channel MOSFET, or bipolar. In an embodiment, switches 110-116 are NMOS. In an alternative embodiment, different devices could be used such as JFET or PMOS for switches 110-116.

In an integrated circuit, the VCO circuit of FIG. 1 may be fabricated on a multi-layer substrate where each of the devices (capacitor, inductor, and switch) are coupled with interconnection wires 130-146. Interconnection wires are metal lines connecting various electronic devices within the integrated circuit. Each of these interconnection wires has its associated parasitic resistance and capacitance that will contribute to the overall parasitic resistance and capacitance of the LC tank. As a result, the Q factor of the VCO degrades due to the increased parasitic components.

Figure 2A:
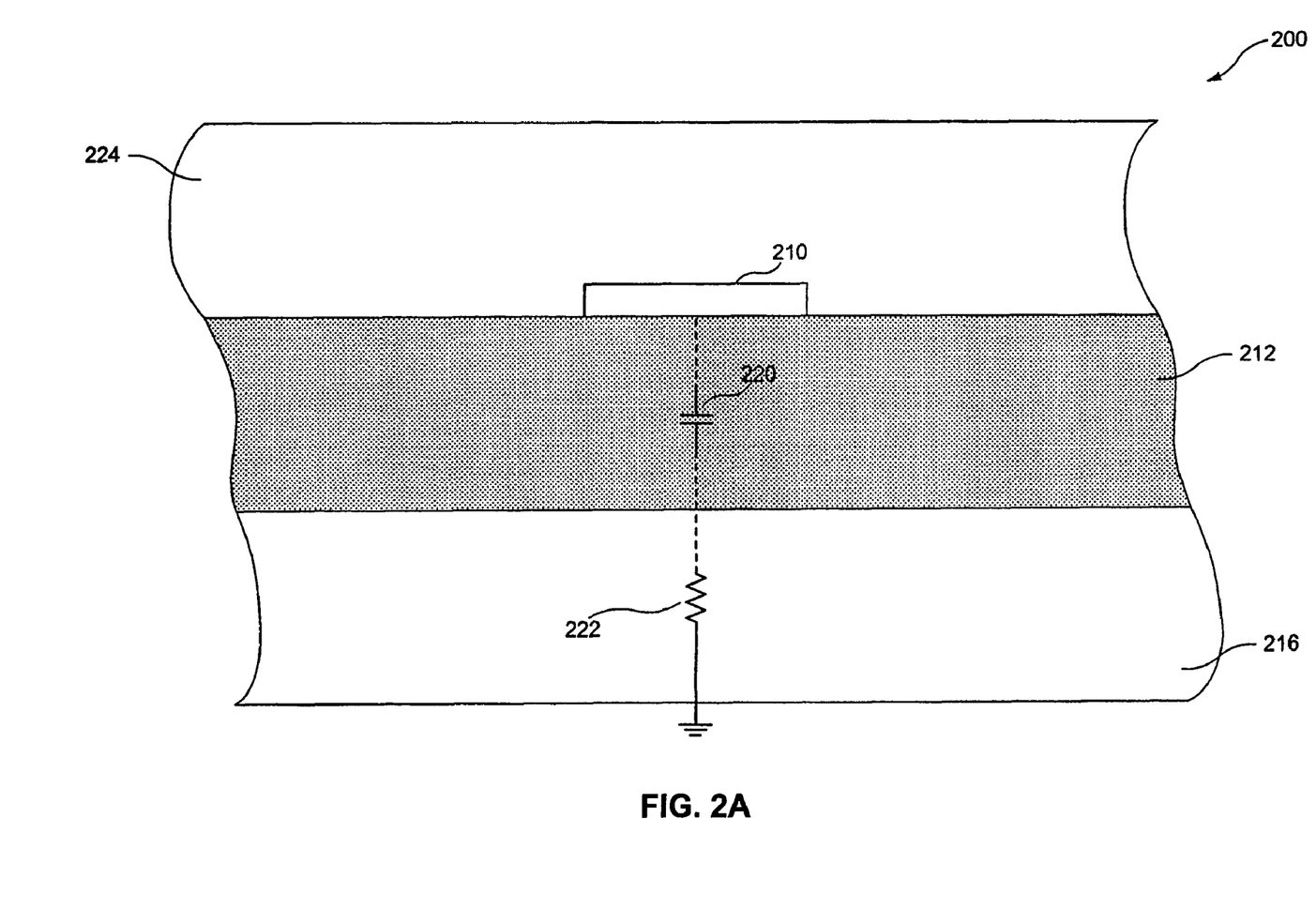
FIG. 2A illustrates an interconnection wire in a semiconductor device.

FIG. 2A is a cross-sectional view of an interconnection wire in a multi-layer substrate of a semiconductor device. The semiconductor device portion 200 comprises a metal element 210, and substrate layers 212, 224, and 216. Substrate layers 212 and 224 may be composed of dielectric material such as organic polyimide, silicon dioxide, or aerogel. Although semiconductor portion 200 shows a metal element 210 embedded between the two substrate layers 212 and 224, the metal element could also be suspended in one uniform substrate layer. For example, substrate 212 and 224 could be made of the same material having the same dielectric constant. Alternatively, semiconductor device 200 does not include layer 224. In this way, metal element 210 is exposed to air.

For modeling purposes, FIG. 2A shows a capacitive element $C_{wire}$ 220 and a resistive element $R_{wire}$ 222 associated with the metal element 210. At a micro level, the metal element (interconnection wire) 210 can be modeled as a narrow plate. For a narrow plate, fringe capacitance is a factor due to the electric field flux lines coming from the side of the plate. Therefore, the total capacitance of a narrow plate is the combination of fringe capacitance and the parallel plate capacitance. The simplified equation for the parasitic capacitance of an interconnection wire is shown below. Where w and H are the $$c_{wire} = c_{pp} + c_{fringe} = \frac{w\varepsilon_{di}}{t_{di}} + \frac{2\pi\varepsilon_{di}}{\log(t_{di}/H)}$$

width and height of the wire, respectively. $\varepsilon_{di}$ is the dielectric constant of the substrate layer 212. And $t_{di}$ is the thickness of the substrate layer 212.

Figure 2B:
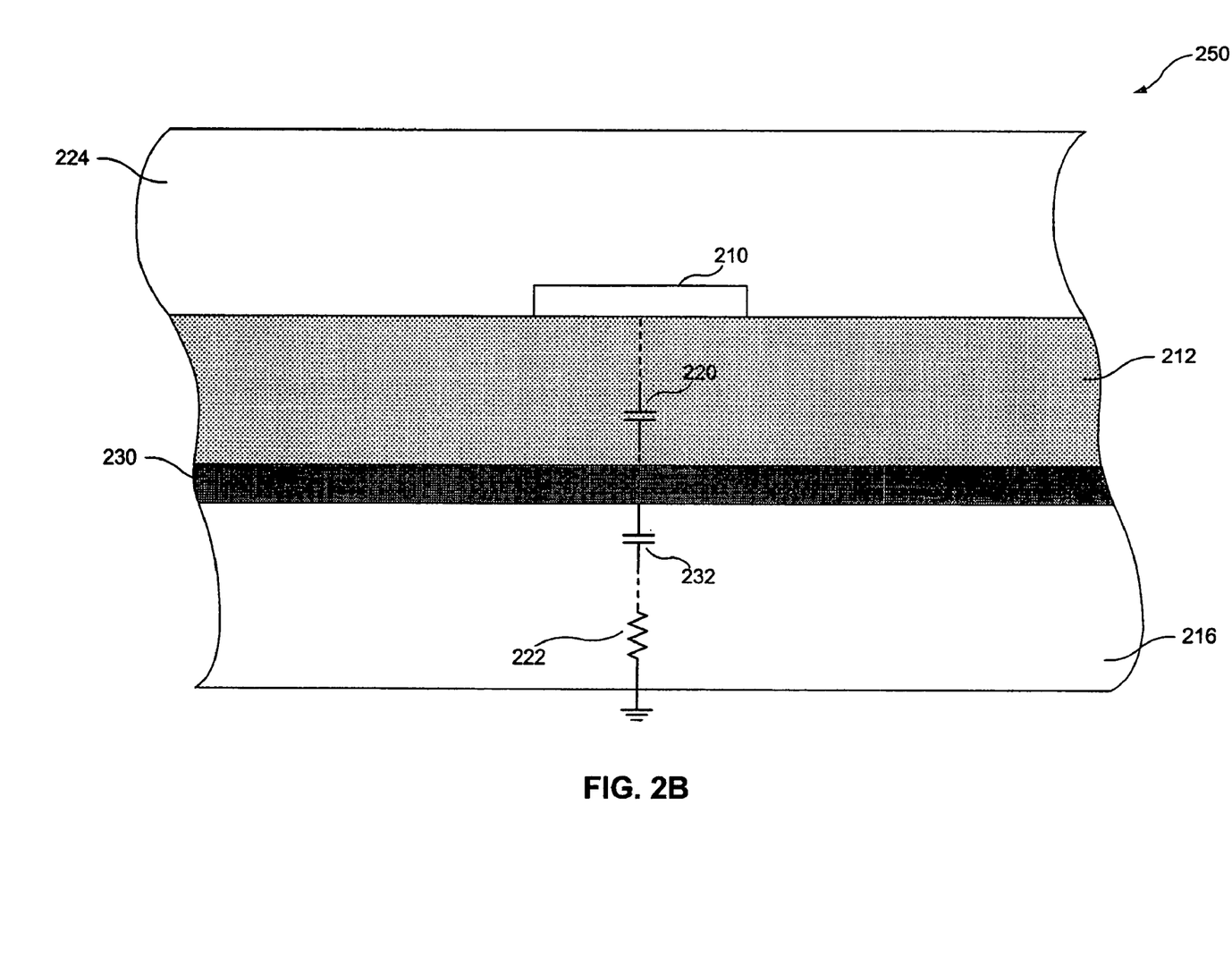
FIG. 2B illustrates a conventional method for shielding an interconnection wire.

FIG. 2B illustrates a method of shielding the metal element in an effort to reduce cross-talk, substrate noise, and signal propagation delays. FIG. 2B shows a metal layer 230 being added and grounded between the dielectric layer 212 and the substrate layer 216. However, adding a metal layer 230 will increase the parasitic capacitance of the semiconductor device. This is due to the smaller distance between the metal layer 230 and metal element 210. Substrate layer 216 is typically composed of a P-type substrate. In a silicon based substrate, acceptor dopant (p-type) such as boron could be used to form the P-substrate. Alternatively, in a gallium arsenide based substrate, carbon, beryllium or zinc could be used as the acceptor dopant. Because of the high resistivity, the substrate 216 carries a parasitic resistance element 222 that degrades the overall Q factor of the semiconductor. This associated parasitic resistance of substrate layer 216 can be avoided with the addition of the metal shield layer 230 at the expense of extra parasitic capacitance between metal element 210 and metal layer 230.

Figure 3:
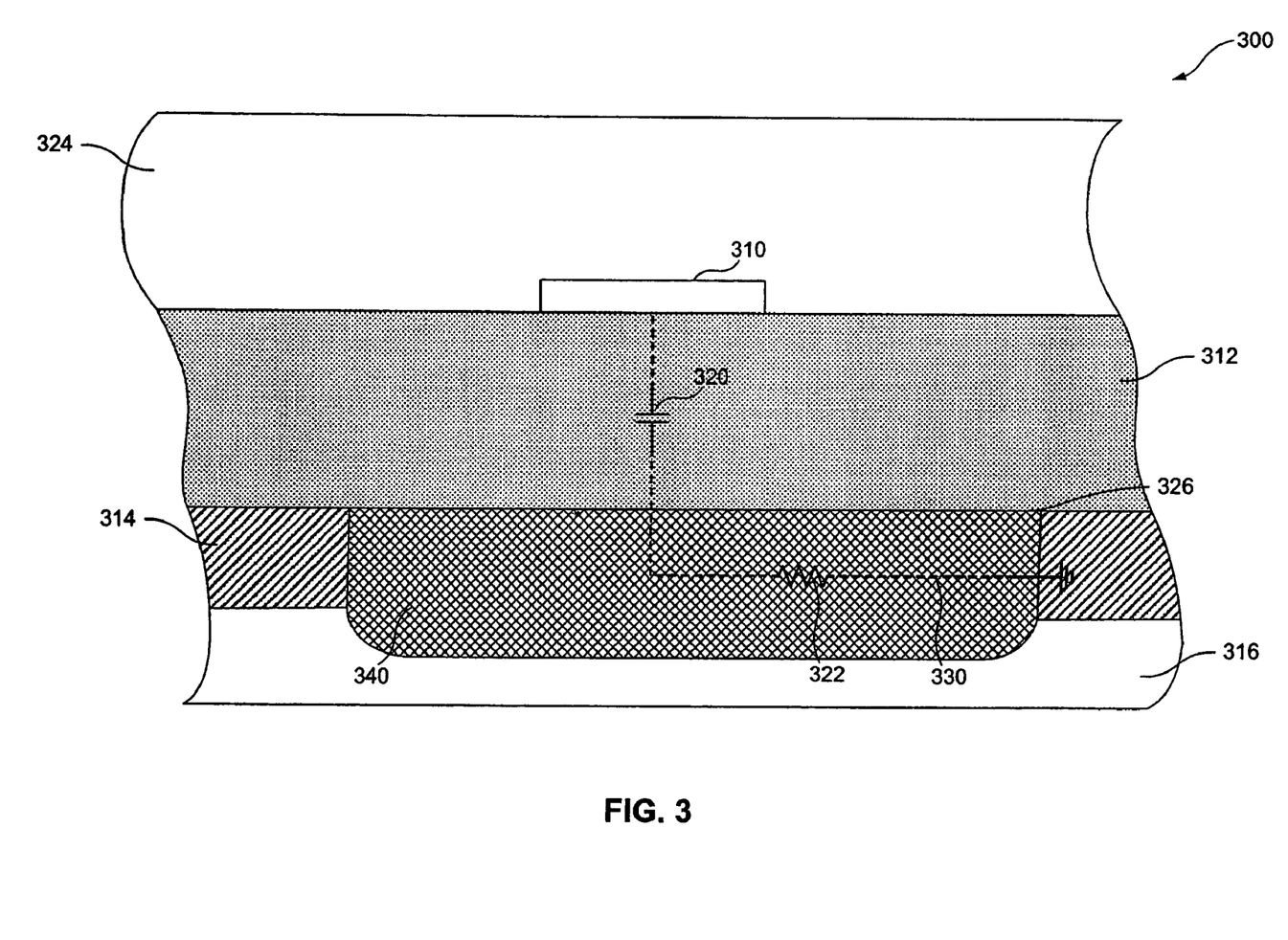
FIG. 3 illustrates a shielding method in accordance with an embodiment of the present invention.

FIG. 3 illustrates an exemplary semiconductor device 300 in accordance with an embodiment of the present invention. The semiconductor device 300 includes a metal element 310, substrate layers 312, 316, 324, a ground layer 314, and a low resistive layer 340. Although semiconductor portion 300 shows a metal element 310 embedded between the two substrate layers 312 and 324, the metal element could also be suspended in one uniform substrate layer. Substrate layers 312 and 324 may be made of the same dielectric material. In an alternative embodiment, metal element 310 is formed on top of substrate layer 312 and layer 324 is not present.

In the semiconductor device 300, a ground layer 314 is formed on the substrate layer 316. The ground layer 314 is electrically coupled to a ground (not shown). The ground layer 314 includes an opening 326 that extends through the entire ground layer 314. In an alternative embodiment, the opening 326 only extends through a portion of the ground layer's 314 thickness. The opening 326 is designed to be located directly underneath the metal element 310. Alternatively, depending on the relative position of observation, the opening 326 is designed to be located directly above metal element 310.

In the opening 326, a substrate layer 340 is formed. Substrate layer 340 is highly P doped as compared to the P substrate layer 316. Substrate layer 340 may be formed by masking layer 316 prior to the doping of substrate layer 340. In an embodiment, substrate layer 340 is formed by heavily doping the substrate layer 316 with an acceptor dopant such as boron. In this way, a P+ type substrate material is formed. In an alternative embodiment, substrate layer 316 can be doped with an acceptor dopant such as carbon, beryllium or zinc. As the result of the highly concentrated P doping, substrate layer 340 exhibits a very low resistivity as compared to the resistivity of the substrate layer 316.

As shown in FIG. 3, the substrate layer 340 is directly beneath metal element 310. Alternatively, if the semiconductor device 300 is flipped upside down, the substrate layer 340 is directly above the metal element 310. The relative position of substrate layer 340 and the metal element 310 is not exactly restrictive as long as the modeled parasitic capacitive element 320 appears between the metal element 310 and the substrate layer 340. For example, the metal element 310 may be skewed or off-center with respect to a perpendicular centerline of the substrate layer 340.

In the semiconductor 300, ground layer 314 is in contact with the substrate layer 340 thereby electrically grounding it. In an alternative embodiment, the ground layer 314 is not in contact with the substrate layer 340, but the substrate layer 340 is electrically coupled to ground with other means such as a ground wire connecting the two.

With the presence of the low resistive layer 340, the parasitic resistance component 322 is smaller as compared to the parasitic resistance component 222. The resistive component 322 is smaller due in part to the grounding path 330 (low resistive path) formed in the highly p-type doped layer 340. In this way, the low resistive path to ground helps reduce the parasitic resistance 322.

Figure 4:
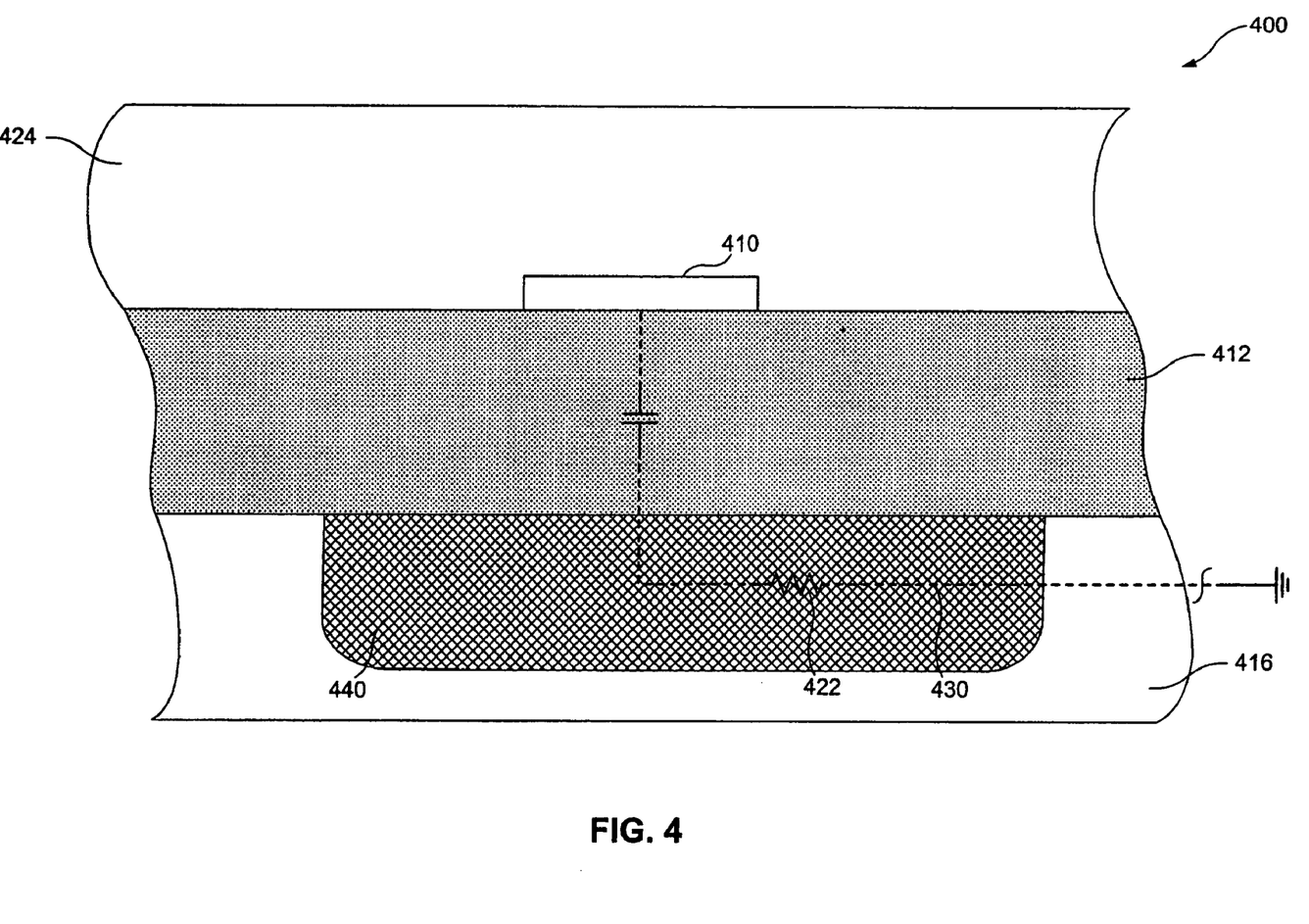
FIG. 4 illustrates another shielding method that may be used in embodiments of the present invention.

FIG. 4 illustrates an exemplary semiconductor device 400 in accordance to another embodiment of the present invention. The semiconductor device 400 includes a metal element 410, substrate layers 412, 416, 424, and a low resistive layer 440. Although semiconductor portion 400 shows a metal element 410 embedded between the two substrate layers 412 and 424, the metal element could also be suspended in one uniform substrate layer. Substrate layers 412 and 424 may be made of the same dielectric material. In an alternative embodiment, metal element 410 is formed on top of substrate layer 412 with no top layer 424.

In the semiconductor device 400, a substrate layer 440 is formed on the substrate layer 416. Substrate layer 440 is highly P doped as compared to the P substrate layer 416. As the result of the highly concentrated P doping, substrate layer 440 exhibits a very low resistivity as compared to the resistivity of the substrate layer 416.

As shown in FIG. 4, the substrate layer 440 is directly beneath metal element 410. Alternatively, if the semiconductor device 400 is flipped upside down, the substrate layer 440 is directly above the metal element 410. The relative position of substrate layer 440 and the metal element 410 is not exactly restrictive as long as the modeled parasitic capacitive element 420 appears between the metal element 410 and the substrate layer 440. For example, the metal element 410 may be skewed or off-center with respect to a perpendicular centerline of the substrate layer 440.

In the semiconductor 400, the substrate layer 440 is electrically coupled to a ground (not shown). As a result, a path to ground 430 is provided through the low resistive layer 440, thereby lowering the parasitic resistance component 422 of the semiconductor device 400.

Figure 5:
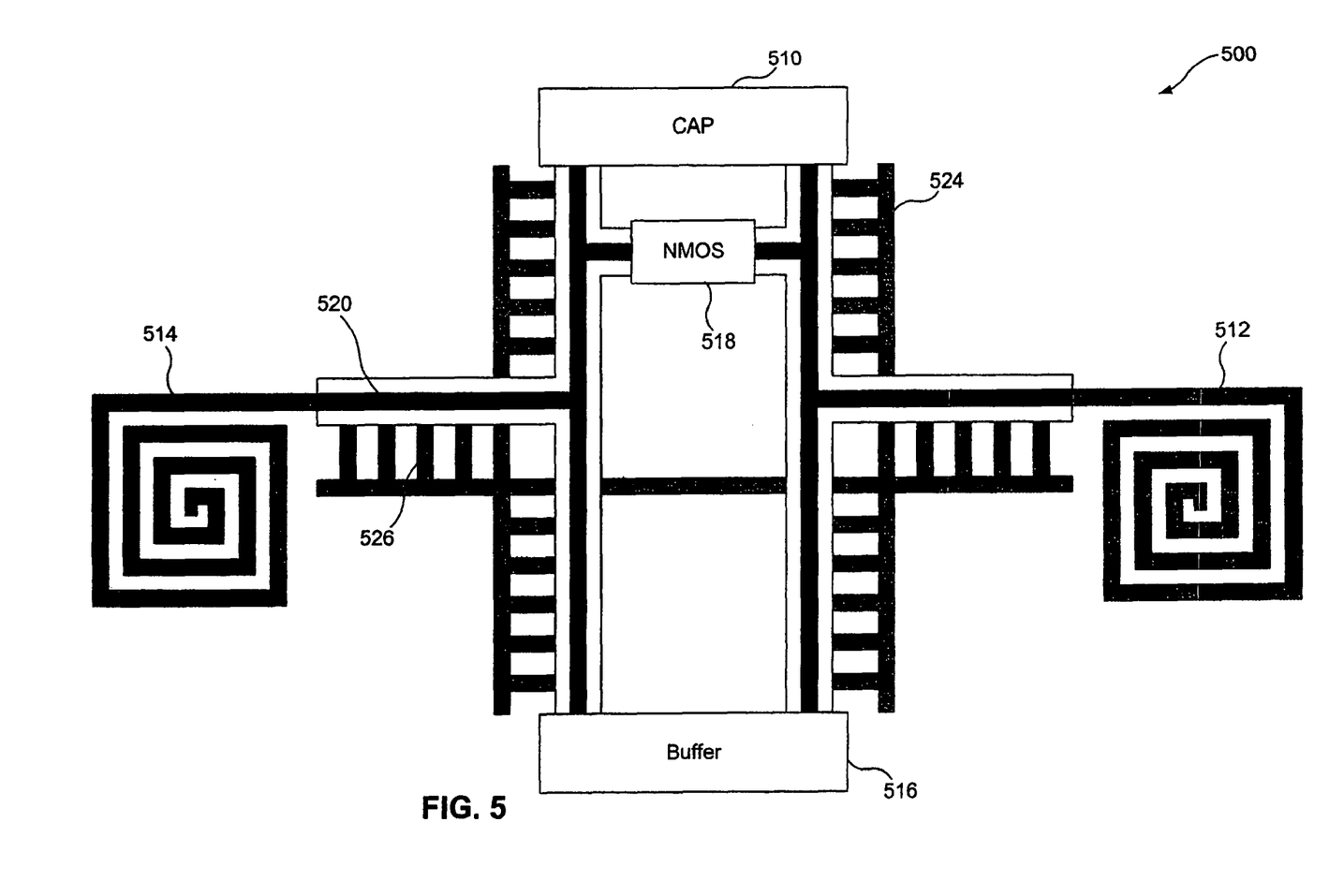
FIG. 5 illustrates an exemplary integrated circuit layout containing an embodiment of the present invention.

FIG. 5 depicts a top view of an exemplary circuit layout of a semiconductor device 500 in accordance with an embodiment of the present invention. Semiconductor device 500 includes capacitor bank 510, buffer 516, NMOS circuitry 518, inductors 512 and 514, interconnection lines 520, highly P doped (low resistive) layer 524, and grounding lines 526.

In the semiconductor 500, interconnection lines 520 electrically connect the capacitor bank 510, inductors 512 and 514, buffer 516, and NMOS 518 together. The highly P doped layer 524 lies between the interconnection lines 520 and the base substrate. In this way, the highly P doped layer 524 provides a low resistive barrier between the interconnection line 520 and the substrate layer 416 (see FIG. 4). In an embodiment, the highly P doped layer 524 is intermittently coupled to the grounding lines 526. In an alternative embodiment, the grounding lines 526 are formed in continuous contact with highly P doped layer 524.

Figure 6:
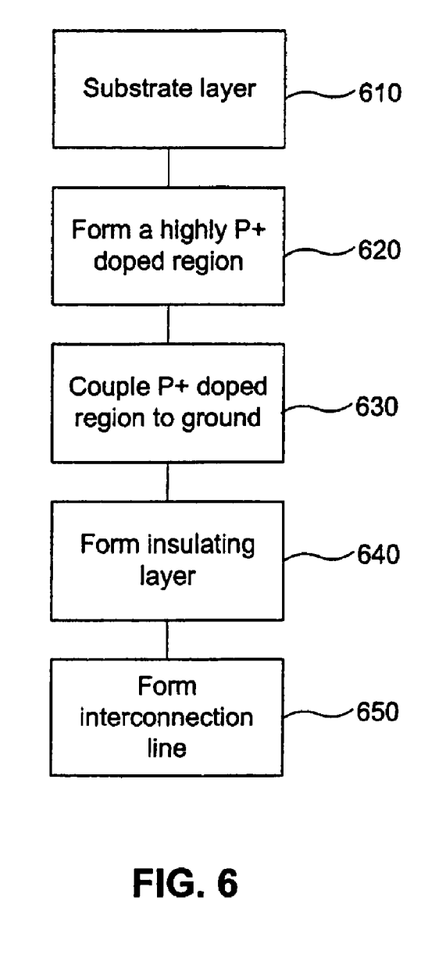
FIG. 6 illustrates a flow diagram for practicing an embodiment of the present invention.

Referring to FIG. 6, in block 610 a substrate layer is provided. This substrate layer could be a silicon based substrate, gallium arsenide based substrate or any other suitable substrate. In block 620, a highly P doped region 440 is formed. This P+ doped region 440 is formed on substrate layer 416 or within the substrate layer 416. The P+ region is highly P doped with dopant as compared to the substrate layer 416. In block 630, the P+ region is electrically coupled to ground. This could be accomplished using a grounding layer or through a via that is electrically coupled to a ground or with other suitable grounding means.

In block 640, an insulating layer 412 is formed on the P+ region. In block 650, an interconnection line 410 is formed on the insulating layer 412. The interconnection line 410 is formed such that it is directly above the highly P+ doped region 440. Alternatively, depending on the relative position of observation, the interconnection line 410 is formed directly below the highly P+ doped region 440.

Figure 7:
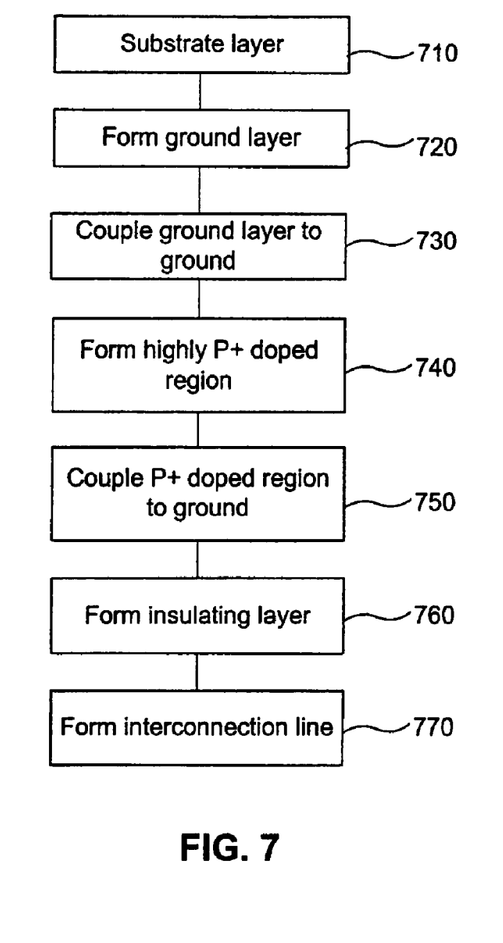
FIG. 7 illustrates a flow diagram for practicing another embodiment of the present invention.

Referring to FIG. 7, in block 710 a substrate layer is provided. This substrate layer could be a silicon based substrate, gallium arsenide based substrate or any other suitable substrate. In block 720, a ground layer 314 is formed on the substrate layer. The ground layer 314 can be made with metal or with any other suitable grounding materials. In block 730, the ground layer is then electrically coupled to ground. In block 740, a highly P doped region 340 is formed. This P+ doped region 340 is formed on substrate layer 316 or within the substrate layer 316. The P+ region 340 is preferably located in an opening of the grounding layer 314. The P+ region is highly P doped with dopant as compared to the substrate layer 316.

In block 750, the P+ region is electrically coupled to ground. This could be accomplished using a grounding layer or through a via that is electrically coupled to a ground or with other suitable grounding means. In block 760, an insulating layer 312 is formed on the P+ region. In block 770, an interconnection line 310 is formed on the insulating layer 312. The interconnection line 310 is formed such that it is directly above the highly P+ doped region 340. Alternatively, depending on the relative position of observation, the interconnection line 310 is formed directly below the highly P+ doped region 340.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

We claim:

1. A semiconductor device, comprising:
   a first substrate characterized by a first resistivity;
   a ground layer formed on the first substrate;
   a second substrate characterized by a second resistivity formed on the first substrate, in an opening of the ground layer;
   a third substrate formed on the second substrate; and
   a metal element formed on the third substrate,
   wherein the second substrate is electrically coupled to the ground layer via a ground path formed in the second substrate, the ground path separate from any ground path provided by the first substrate, and
   wherein the first resistivity is higher than the second resistivity.

2. The semiconductor device of claim 1, wherein the metal element has a surface and a plane normal to the surface, and wherein the metal element is situated on the third substrate such that the normal plane intersects the second substrate.

3. The semiconductor device of claim 1, wherein the metal element is an interconnection wire.

4. The semiconductor device of claim 1, wherein the second substrate is highly doped with acceptor dopant as compared to the first substrate.

5. The semiconductor device of claim 1, wherein the second substrate is doped to form a P+ doped region, wherein the P+ doped region is highly P doped as compared to the first substrate.

6. The semiconductor device of claim 1, wherein the second substrate is electrically coupled to the ground layer via a ground wire.

7. The semiconductor device of claim 1, wherein the second substrate is in contact with the ground layer.

8. A semiconductor device, comprising:
   a first substrate layer formed on a first plane, the first substrate layer having a first resistivity;
   a metal element formed on a second plane, wherein the second plane is substantially parallel to the first plane;

a ground layer formed on the first substrate layer, wherein the ground layer is located between the first and the second planes, and wherein the ground layer is electrically grounded; and a second substrate layer having a second resistivity formed in an opening of the ground layer, wherein the second substrate layer is electrically coupled to the ground layer via a ground path formed in the second substrate layer, the ground path separate from any ground path provided by the first substrate layer, wherein the first resistivity is higher than the second resistivity.

9. The semiconductor device of claim 8, wherein the opening extends through the ground layer.

10. The semiconductor device of claim 8, wherein the metal element has a third plane normal to the second plane, and wherein the metal element is situated on the second plane such that the third plane intersects the second substrate layer.

11. The semiconductor device of claim 8, wherein the metal element is an interconnection wire.

12. The semiconductor device of claim 8, wherein the second substrate layer is highly doped with acceptor dopant as compared to the first substrate layer.

13. The semiconductor device of claim 8, wherein the second substrate layer is doped to form a P+ doped region, wherein the P+ doped region is highly P doped as compared to the first substrate layer.

14. The semiconductor device of claim 8, wherein the second substrate layer is electrically coupled to the ground layer via a ground wire.

15. The semiconductor device of claim 8, wherein the second substrate layer is in contact with the ground layer.

* * * * *